United States Patent
Theuss et al.

(10) Patent No.: US 7,851,925 B2
(45) Date of Patent: Dec. 14, 2010

(54) WAFER LEVEL PACKAGED MEMS INTEGRATED CIRCUIT

(75) Inventors: Horst Theuss, Wenzenbach (DE);
Markus Loehndorf, Munich (DE);
Florian Schoen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 216 days.

(21) Appl. No.: 12/234,406

(22) Filed: Sep. 19, 2008

(65) Prior Publication Data

US 2010/0072626 A1 Mar. 25, 2010

(51) Int. Cl.
*H01L 27/12* (2006.01)
*H01L 23/48* (2006.01)

(52) U.S. Cl. .............. 257/774; 257/693; 257/704; 257/347; 257/E23.067; 257/E23.128

(58) Field of Classification Search ......... 257/678–733, 257/E23.001–E23.194, 924, 37, 774, E21.32, 257/E21.561, E21.564, E21.7, E21.703, E21.704
See application file for complete search history.

(56) References Cited

U.S. PATENT DOCUMENTS

| | | | |
|---|---|---|---|
| 6,630,725 B1 * | 10/2003 | Kuo et al. | 257/659 |
| 6,635,509 B1 | 10/2003 | Ouellet | |
| 6,710,461 B2 | 3/2004 | Chou et al. | |
| 6,734,762 B2 | 5/2004 | Cornett et al. | |
| 6,836,020 B2 | 12/2004 | Cheng et al. | |
| 6,858,466 B1 | 2/2005 | Bower et al. | |
| 7,061,099 B2 * | 6/2006 | Lu et al. | 257/704 |
| 7,098,070 B2 | 8/2006 | Chen et al. | |
| 7,109,635 B1 | 9/2006 | McClure et al. | |
| 7,154,173 B2 * | 12/2006 | Ikeda et al. | 257/704 |
| 7,262,622 B2 * | 8/2007 | Zhao | 324/763 |
| 7,656,023 B2 * | 2/2010 | Sunohara et al. | 257/704 |
| 2004/0245538 A1 | 12/2004 | Wang et al. | |
| 2005/0146401 A1 | 7/2005 | Tilmans et al. | |
| 2006/0105496 A1 | 5/2006 | Chen et al. | |
| 2006/0113598 A1 | 6/2006 | Chen et al. | |
| 2006/0160273 A1 | 7/2006 | Chen | |
| 2006/0263931 A1 | 11/2006 | McClure et al. | |
| 2007/0099395 A1 | 5/2007 | Sridhar et al. | |
| 2007/0108160 A1 | 5/2007 | Ngo et al. | |
| 2007/0141804 A1 | 6/2007 | Sankarapillai et al. | |
| 2007/0184624 A1 | 8/2007 | Mueller et al. | |
| 2007/0187719 A1 | 8/2007 | Yuan et al. | |

(Continued)

OTHER PUBLICATIONS

G. Piazza et al., article entitled "Voltage-Tunable Piezoelectrically-Transduced Single-Crystal Silicon Micromechanical Resonators"; Aug. 19, 2003; 8 pgs.

(Continued)

*Primary Examiner*—Jasmine J Clark
(74) *Attorney, Agent, or Firm*—Dicke, Billig & Czaja, PLLC

(57) ABSTRACT

A wafer-level packaged integrated circuit includes a semiconductor substrate including a first silicon layer. A microelectromechanical system (MEMS) device is integrated into the first silicon layer. A thin-film deposited sealing member is deposited over the first silicon layer and is configured to seal a cavity in the first silicon layer. At least one additional layer is formed over the sealing member. At least one under bump metallization (UBM) is formed over the at least one additional layer.

15 Claims, 9 Drawing Sheets

U.S. PATENT DOCUMENTS

2007/0228540 A1  10/2007  Kocian et al.
2007/0257728 A1  11/2007  Boser et al.
2007/0267723 A1  11/2007  Bernstein et al.
2008/0136009 A1   6/2008  Theuss et al.

OTHER PUBLICATIONS

R. Dixon et al., newsletter article entitled "MEMS Inertial Sensors Go Consumer"; May 2006; 12 pgs.

J. Bouchaud et al., article entitled "MEMS, Microfluidics and Microsystems Executive Review"; Oct. 12, 2006; 5 pgs.

D Manners, electronicweekly.com webpage entitled "US Firm SiTime Puts MEMS and CMOS Together"; Oct. 16, 2007; 2 pgs.

R.C. Johnson, EETimes.com webpage entitled "MEMS Eyes Quartz Crystal Apps"; Oct. 23, 2006; 4 pgs.

A. Alastalo, publication entitled "Microelectromechanical Resonator-Based Components for Wireless Communications"; Oct. 2006; 118 pgs.

R.C. Johnson, EETimes.com webpage entitled "SiTime Lands MEMS Design Wins"; Mar. 1, 2007; 1 pg.

SiTIME.com homepage, available at http://www.sitime.com; undated; 1 pg.

Dr. A. Partridge et al., publication entitled "MEMS Resonators: Getting the Packaging Right"; undated; 4 pgs.

Dr. T.F. Marinis; publication entitled "The Future of MEMS"; 2007; 24 pgs.

Dr. A. Partridge et al., publication entitled "Precision Silicon MEMS Resonators Verses Traditional Quartz"; undated; 10 pgs.

B.D. Wissman, Solid State Technology article entitled "Silicon and WLP Enable Commercial-Grade MEMS Resonators"; available at http://sst.pennnet.com/display__294548/5/ARTCL/none/none/1/Silicon-and-WLP-enable-commercial-grade-MEMS-resonators; 5 pgs.; Jun. 2007.

W. Raberg et al., US patent application entitled "Integrated MEMS Device and Control Circuit"; U.S. Appl. No. 12/105,989, filed Apr. 18, 2008; 31 pgs.

* cited by examiner

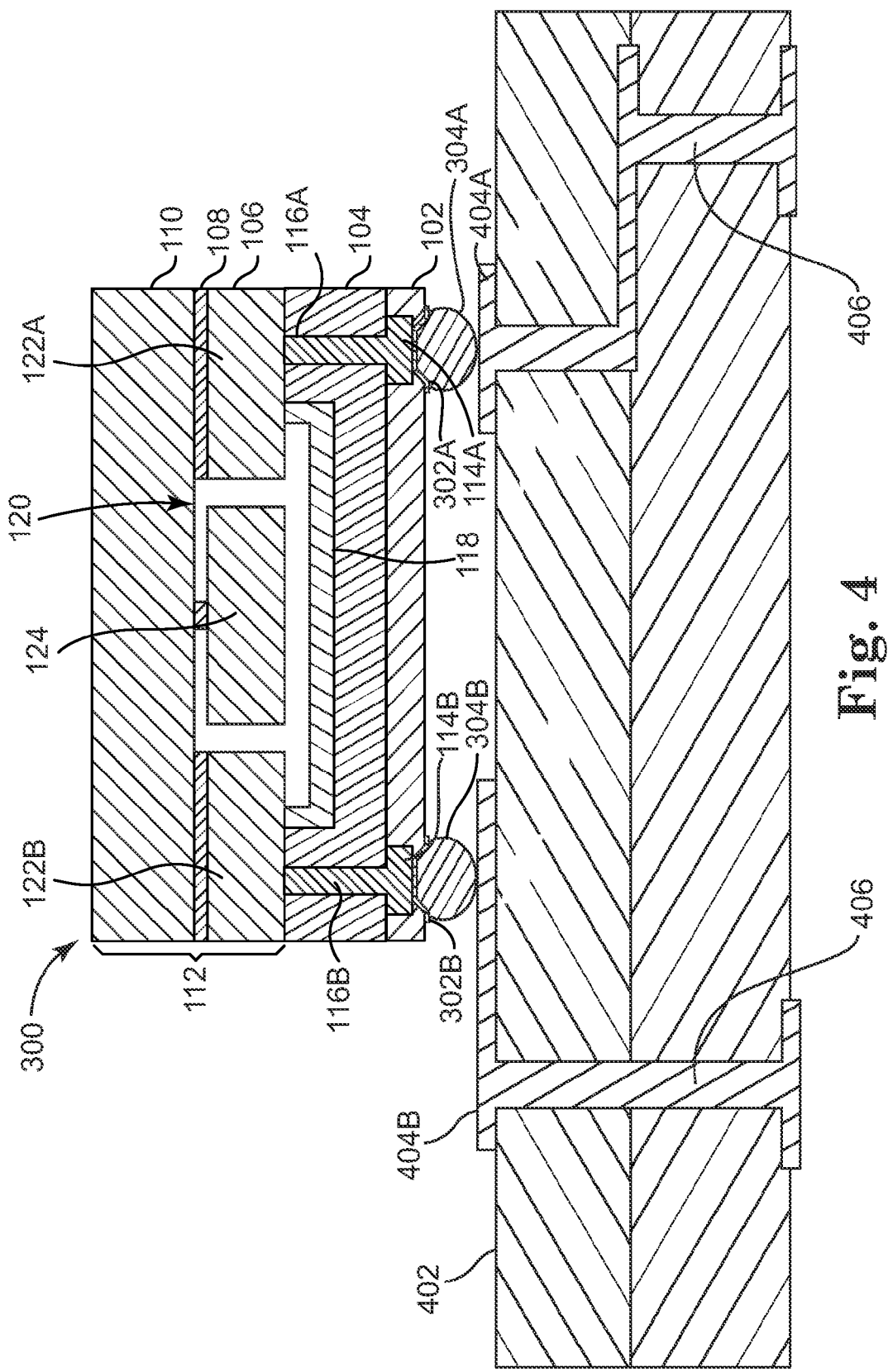

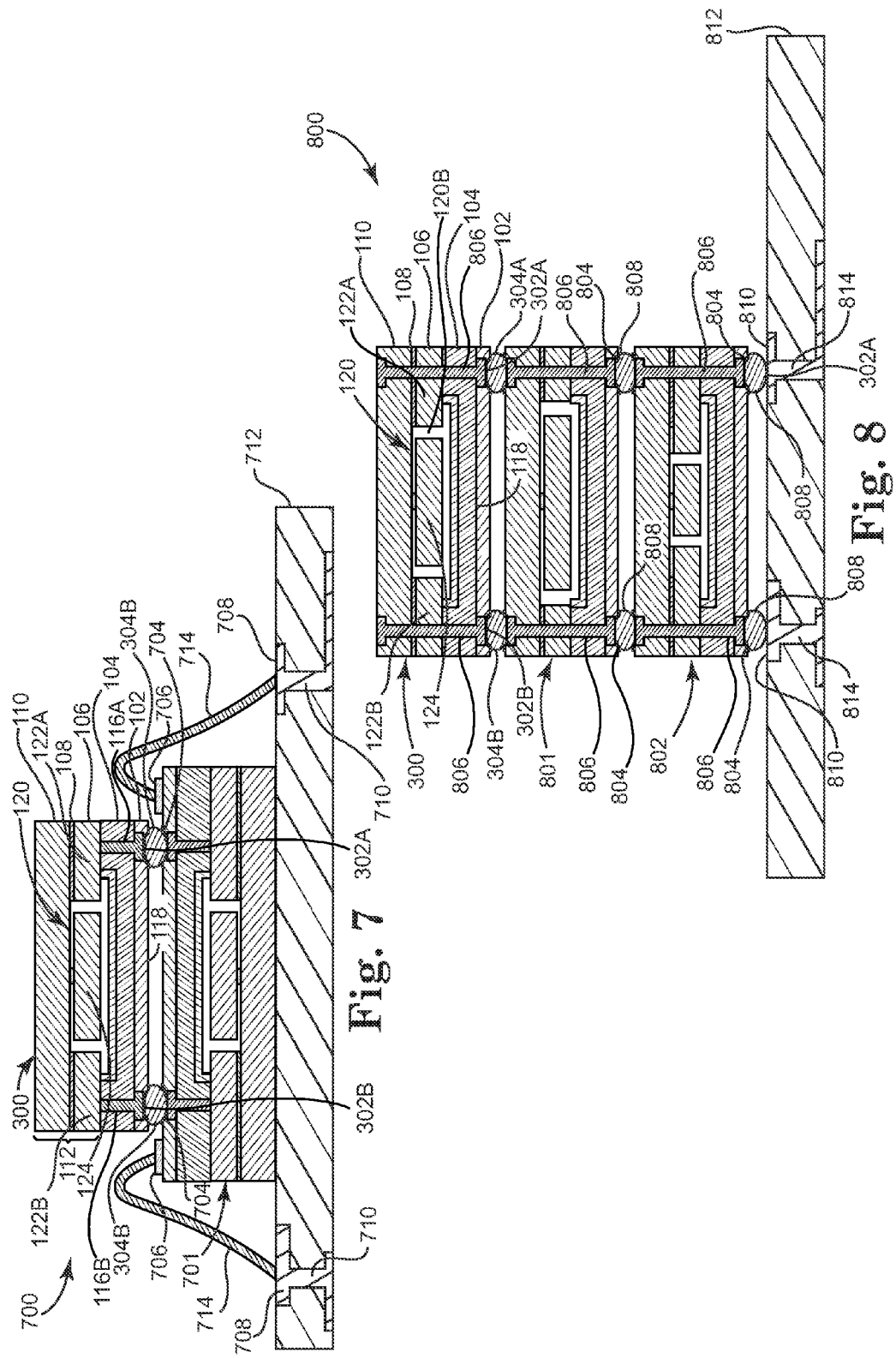

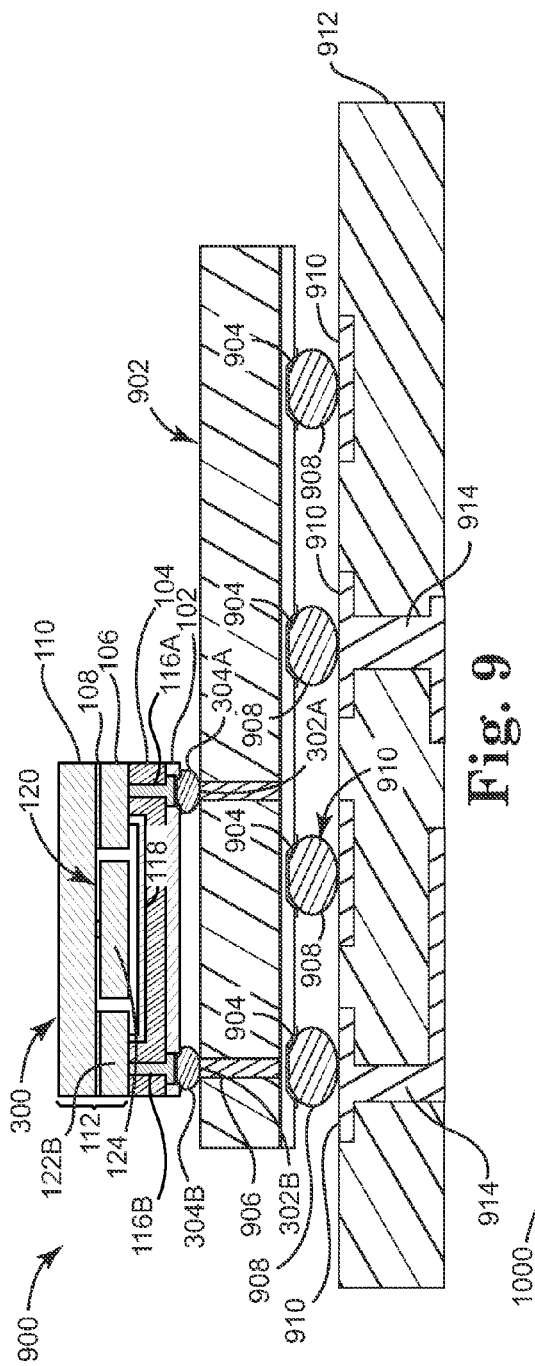
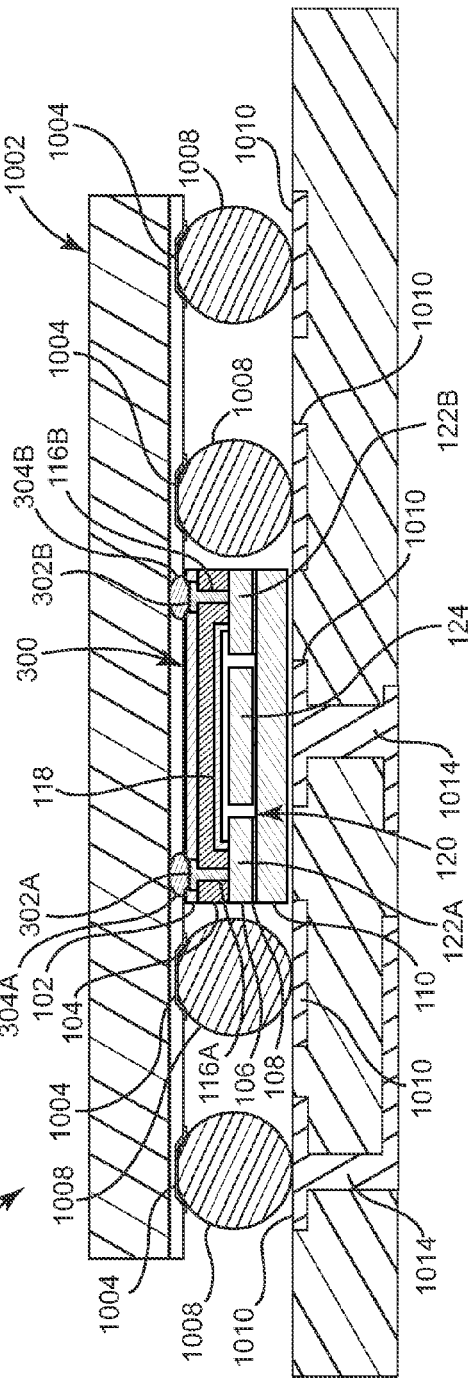

US 7,851,925 B2

WAFER LEVEL PACKAGED MEMS INTEGRATED CIRCUIT

BACKGROUND

Many integrated circuits (ICs) use a driving frequency which is provided by a resonator device. The resonator device has typically been a quartz oscillator. However, quartz oscillators typically have a high area consumption, limited options for integration of the quartz onto an IC chip, and limited accessible frequency range (e.g., the higher the frequency, the more expensive the quartz solution gets). Recently, another solution has been generated, which is referred to as a silicon oscillator or silicon clock. The silicon oscillator technology is based on the oscillation of silicon bulk material under the influence of an electrical field with a frequency that is defined by the geometry of the silicon resonator. Silicon oscillators are typically manufactured on silicon wafers using semiconductor technologies.

Silicon oscillator chips are packaged in order to form a component that can be assembled onto a substrate. However, standard packaging procedures, such as those that use a cap wafer, typically enlarge the size of the component significantly so that the small-size advantage of the silicon oscillator technology is lost.

SUMMARY

One embodiment provides a wafer-level packaged integrated circuit that includes a semiconductor substrate including a first silicon layer. A micro-electromechanical system (MEMS) device is integrated into the first silicon layer. A thin-film deposited sealing member is deposited over the first silicon layer and is configured to seal a cavity in the first silicon layer. At least one additional layer is formed over the sealing member. At least one under bump metallization (UBM) is formed over the at least one additional layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 is a diagram illustrating the wafer-level packaged MEMS device shown in FIG. 3B attached to a printed circuit board (PCB) according to one embodiment.

FIG. 7 is a diagram illustrating the wafer-level packaged MEMS device shown in FIG. 3B packaged together with an additional MEMS resonator device in a stacked manner according to one embodiment.

FIG. 8 is a diagram illustrating the wafer-level packaged MEMS device shown in FIG. 3B packaged together with two additional MEMS resonator devices in a stacked manner according to one embodiment.

FIG. 9 is a diagram illustrating the wafer-level packaged MEMS device shown in FIG. 3B packaged together with an application specific integrated circuit (ASIC) in a stacked manner according to one embodiment.

FIG. 10 is a diagram illustrating the wafer-level packaged MEMS device shown in FIG. 3B packaged together with an application specific integrated circuit (ASIC) in a stacked manner according to another embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
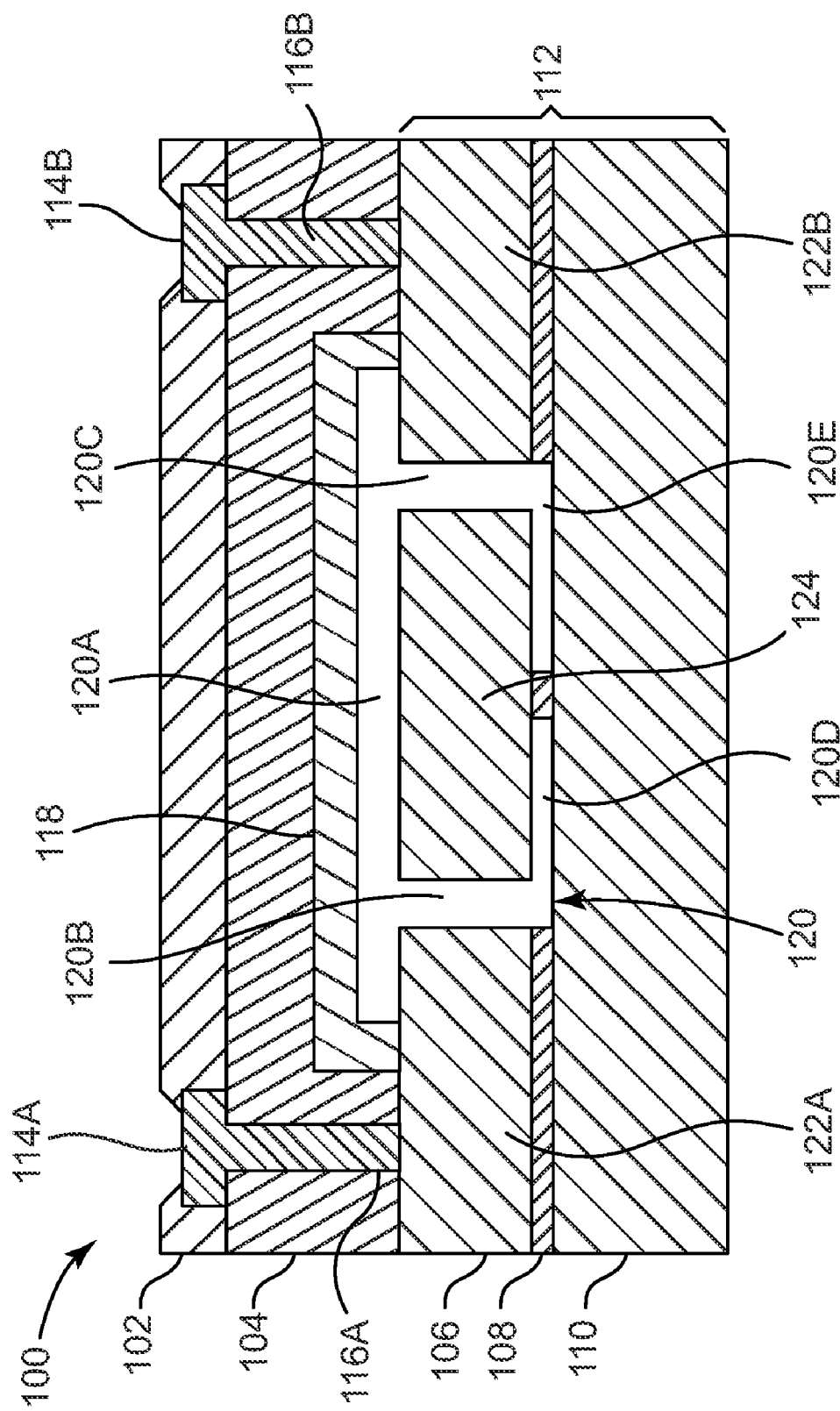
FIG. 1 is a diagram illustrating a cross-sectional view of a MEMS device according to one embodiment.

FIG. 1 is a diagram illustrating a cross-sectional view of a micro-electromechanical (MEM or MEMS) device 100 according to one embodiment. In the illustrated embodiment, MEMS device 100 is a silicon MEMS resonator. MEMS device 100 includes a semiconductor substrate 112, an insulating layer 104, a passivation layer 102, metal-filled vias 116A and 116B, contact pads 114A and 114B, cavity sealing member 118, cavity 120, electrodes 122A and 122B, and resonator structure 124. In one embodiment, substrate 112 is a silicon-on-insulator (SOI) substrate. SOI substrate 112 includes a buried oxide layer 108 sandwiched between two single crystal silicon layers 106 and 110. Silicon layer 106 will be referred to herein as the top-side silicon layer of substrate 112, and silicon layer 110 will be referred to herein as the bottom-side silicon layer of substrate 112.

Resonator structure 124 and electrodes 122A and 122B are integrated into the top-side silicon layer 106 of the SOI substrate 112. Insulating layer 104 is formed on the top-side silicon layer 106 and the cavity sealing member 118. In one embodiment, insulating layer 104 is an oxide layer, a nitride layer, or a combination of one or more oxide layers and one or more nitride layers. Passivation layer 102 is formed on insulating layer 104. In one embodiment, the passivation layer 102 is a polyimide layer.

Electrodes 122A and 122B are formed in the top-side silicon layer 106 of the substrate 112. Resonator structure 124 is also formed in the top-side silicon layer 106 of the substrate 112, and is substantially surrounded by cavity 120. Cavity 120 includes cavity portions 120A-120E. Cavity portion 120A is formed between sealing member 118 and the top-side silicon layer 106. Cavity portions 120B and 120C are formed in the top-side silicon layer 106. Cavity portions 120D and 120E are formed in the buried oxide layer 108. In one embodiment, cavity 120 is formed using conventional etching or micro machining techniques.

Metal-filled via 116A extends through insulating layer 104 and electrically interconnects electrode 122A and contact pad 114A. Metal-filled via 116B extends through insulating layer 104 and electrically interconnects electrode 122B and contact pad 114B. The contact pads 114A and 114B provide interconnection points for electrically connecting device 100 to other devices or circuits. In one embodiment, the contact pads 114A and 114B are aluminum contact pads.

In operation according to one embodiment, the MEMS resonator 100 is driven by applying an excitation signal to a first one of the electrodes 122A or 122B (e.g., the drive electrode). The excitation signal is applied by a control circuit to the contact pad 114A or 114B coupled to the drive electrode, and travels through the metal-filled via 116A or 116B to the drive electrode. Electric force interaction between the drive electrode and the resonator structure 124 causes the resonator structure 124 to vibrate at a specific frequency, which generates a sense signal on a second one of the electrodes 122A or 122B (e.g., the sense electrode). The sense signal travels through the metal-filled via 116A or 116B and contact pad 114A or 114B connected to the sense electrode, and is received by the control circuit.

Figure 2:
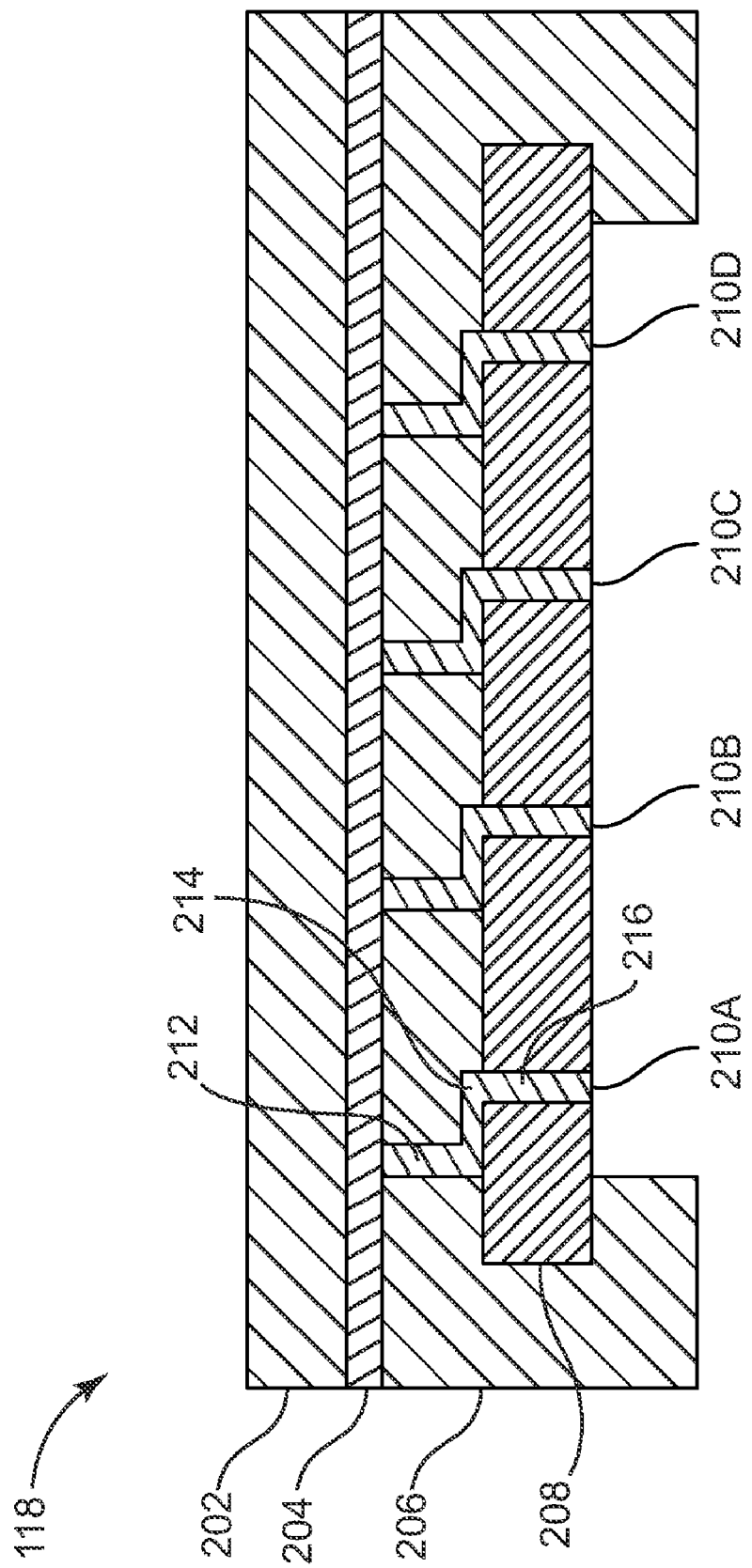
FIG. 2 is a diagram illustrating a cavity sealing member in additional detail according to one embodiment.

FIG. 2 is a diagram illustrating the cavity sealing member 118 in additional detail according to one embodiment. Sealing member 118, according to one embodiment, is a thin-film deposited member that includes a plurality of thin-film deposited layers, including polysilicon layer 202, oxide layer 204, nitride layer 206, and polysilicon layer 208. Sealing member 118 also includes oxide-filled cavities 210A-210D. Oxide-filled cavities 210A-210D each include a first vertical portion 212 that extends vertically through nitride layer 206, a second vertical portion 216 that extends vertically through polysilicon layer 208 and that is laterally offset from the first vertical portion 212, and a horizontal portion 214 that connects the two vertical portions 212 and 216.

In one embodiment, during the formation of MEMS device 100, cavity 120 (FIG. 1) is filled with silicon dioxide, and polysilicon layer 208 is formed over the silicon dioxide filled cavity portion 120A. Polysilicon layer 208 is then structured to form the second vertical portions 216 of the cavities 210A-210D. A silicon dioxide layer is then deposited on the structured polysilicon layer 208, and the silicon dioxide layer is structured to form the horizontal portions 214. The nitride layer 206 is then deposited on the polysilicon layer 208, which includes the structured silicon dioxide layer formed thereon. The nitride layer 206 is structured to form the first vertical portions of the cavities 210A-210D. A chemical wet etch is then performed, which removes the silicon dioxide from the cavities 210A-210D and the cavity 120. During the chemical wet etch, the etchant goes through the cavities 210A-210D and into the cavity 120, and releases the resonator structure 124.

After the resonator structure 124 has been released, oxide layer 204 is deposited on nitride layer 206 using a low-pressure chemical vapor deposition (LPCVD) process to seal the cavity 120. Due to the lateral offset of the two vertical portions 212 and 216 of each of the cavities 210A-210D, the deposited oxide does not enter the cavity 120, but rather remains in the sealing member 118 (i.e., as layer 204, and some or all of each of the cavities 210A-210D may be filled with oxide). In one embodiment, the deposition of the oxide layer 204 is performed at an elevated temperature (e.g., about 800° C.), which results in an improved vacuum in the cavity 120 when the device cools down to room temperature. Polysilicon layer 202 is deposited on oxide layer 204 to provide additional protection for the device and to help ensure that the cavity 120 remains sealed.

Figure 3A:
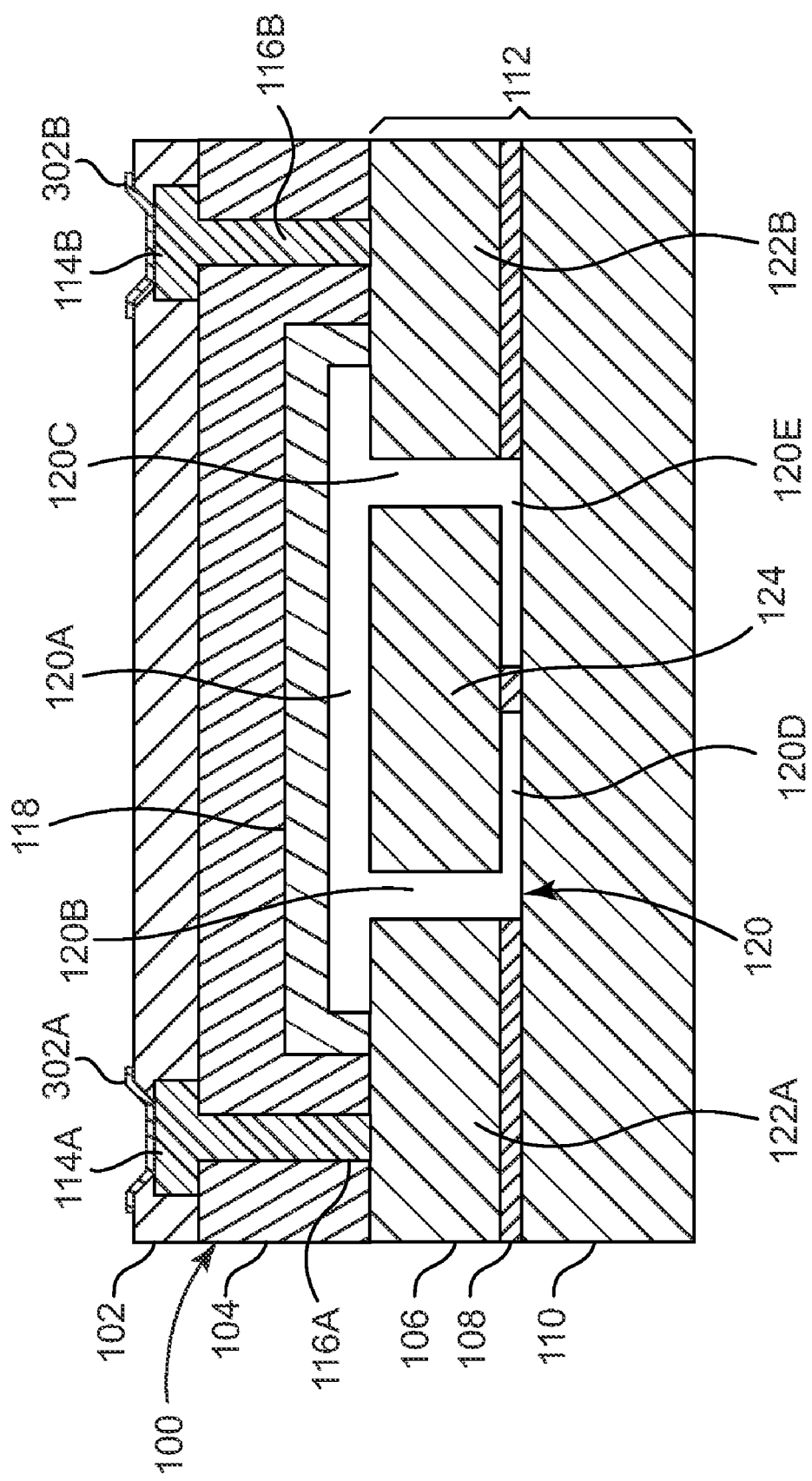
FIGS. 3A and 3B are diagrams illustrating a wafer-level packaging process for packaging the MEMS device shown in FIG. 1 according to one embodiment.
Figure 3B:
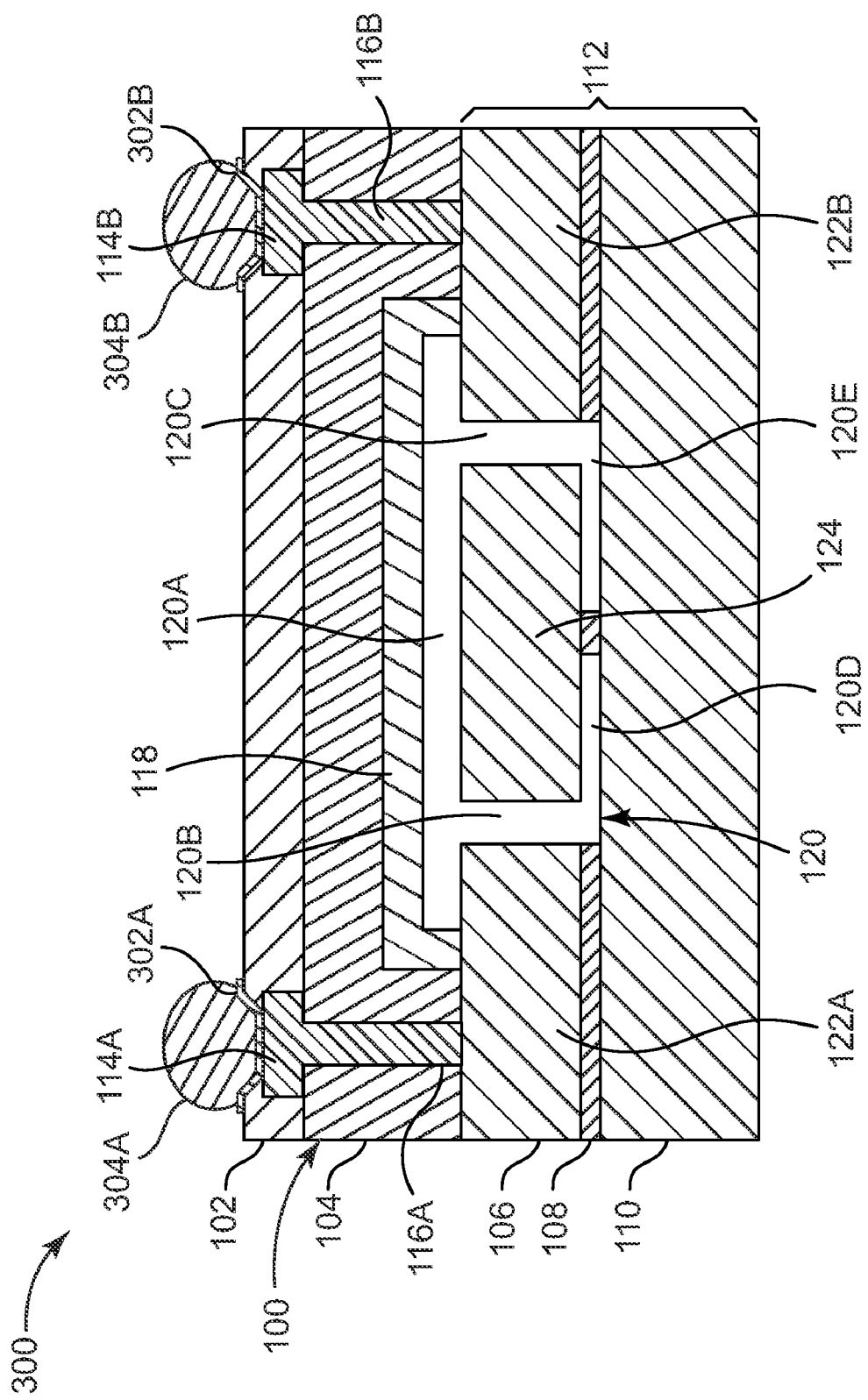

FIGS. 3A and 3B are diagrams illustrating a wafer-level packaging process for packaging the MEMS device 100 shown in FIG. 1 according to one embodiment. As shown in FIG. 3A, under-bump metallizations (UBMs) 302A and 302B are applied to the contact pads 114A and 114B, respectively. As mentioned above, in one embodiment, contact pads 114A and 114B are aluminum. Since aluminum contact pads are not solderable, in one embodiment, UBMs 302A and 302B, which each include a stack of multiple metal layers, are deposited on the contact pads 114A and 114B and serve as an interface between the pads and later-deposited solder elements. This UBM process according to one embodiment is engineered to help ensure a low and stable contact resistance at the interface between the contact pads and the later-deposited solder elements; provide an adhesion layer to the contact pad; provide a diffusion barrier layer to prohibit the solder from reaching the aluminum; provide a solderable layer to form the intermetallic connection to the solder alloy; and provide an oxidation protection layer to ensure robust solderability conditions.

In one embodiment, the formation of UBMs 302A and 302B involves first depositing a titanium, chromium or aluminum film to achieve good adhesion to the chip surface and a low contact resistance to the pads 114A and 114B. Next, a barrier metal film such as nickel vanadium or titanium tungsten is deposited, preventing diffusion of the bump metals to the contact pads 114A and 114B. One or more additional metal layers may then be deposited and used as seed layers for subsequent plating, or as solder wettable material. In one embodiment, UBMs 302A and 302B are deposited via sputtering, electroplating, or evaporation.

As shown in FIG. 3B, conductive interconnection structures 304A and 304B are applied to UBMs 302A and 302B, respectively, thereby forming a wafer-level packaged MEMS device 300. In the illustrated embodiment, interconnection structures 304A and 304B are solder elements (e.g., solder bumps or solder balls). In other embodiments, other types of interconnection structures may be used. After application of the interconnection structures 304A and 304B, packaged MEMS device 300 is suitable for mounting on a substrate (e.g., a PCB) using a conventional surface mount technology (SMT).

In one embodiment, a plurality of MEMS devices 100 are formed in a single substrate (e.g., SOI wafer), and the process shown in FIGS. 3A and 3B is applied to each of the MEMS devices 100 in the substrate. After application of the interconnection structures 304A and 304B to the various devices in the SOI wafer, the SOI wafer is singulated to form a plurality of wafer-level packaged MEMS devices 300.

The wafer level packaging provided in one embodiment takes advantage of the fact that the actual MEMS device 100 has already been encapsulated at the wafer level. Thin film deposition of the sealing member 118 results in a sealed cavity 120 around the resonator structure 124. This enables the application of wafer level packaging technology to create a packaged silicon resonator component 300 without having to use wire bonding or die bonding. The application of wafer level packaging to a silicon MEMS resonator device according to one embodiment provides several advantages, including: The realization of a smaller form factor (e.g., the final packaged device is the same size as the chip itself) than other packaging solutions; the simple realization of integrated devices; low cost; and no need to create a cavity with a cap wafer, which is frequently used in MEMS technology. Creating a cavity with a cap wafer typically involves forming a MEMS device in a first wafer, etching a cavity in a second "cap" wafer, and then attaching the cap wafer over the first wafer.

Wafer level packaging is used in one embodiment to produce many different types of packaged components, including: A wafer-level packaged silicon MEMS resonator; a wafer-level packaged silicon MEMS oscillator that includes a silicon resonator and an application specific integrated circuit (ASIC) for controlling the resonator; a wafer-level packaged filter device including a plurality of silicon MEMS resonators integrated on a single semiconductor die; and various stacked die configurations. Some packaged components according to one embodiment are described in further detail below with reference to FIGS. 4-10.

FIG. 4 is a diagram illustrating the wafer-level packaged MEMS device 300 shown in FIG. 3B attached to a printed circuit board (PCB) 402 according to one embodiment. As shown in FIG. 4, solder balls 304A and 304B of device 300 are soldered to pads 404A and 404B, respectively, of PCB 402. Pads 404A and 404B are each electrically connected to conductors 406 within PCB 402. In another embodiment, MEMS device 300 may be attached to a PCB or another device using a different type of connection technique, such as by gluing or welding.

Figure 5:
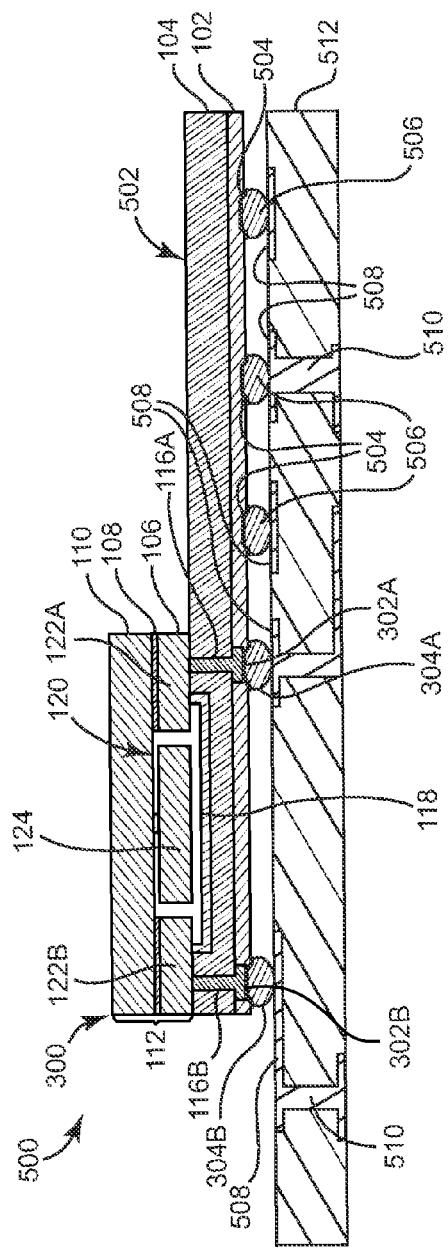
FIG. 5 is a diagram illustrating the wafer-level packaged MEMS device shown in FIG. 3B integrated with an application specific integrated circuit (ASIC) according to one embodiment.

In the embodiment shown in FIGS. 3B and 4, MEMS resonator device 100 is packaged alone as a single stand-alone device. In another embodiment, MEMS device 100 is packaged together on a common semiconductor die with one or more additional integrated circuits. FIG. 5 is a diagram illustrating the wafer-level packaged MEMS device 300 shown in FIG. 3B integrated with an application specific integrated circuit (ASIC) 502 according to one embodiment. In the illustrated embodiment, wafer-level packaged device 500 includes the MEMS device 300 and the ASIC 502, which are integrated together on a common semiconductor die in a side-by-side manner (i.e., the two devices 300 and 502 are positioned laterally adjacent to each other). In one embodiment, device 500 is an integrated silicon MEMS oscillator chip, and ASIC 502 is a control circuit that is configured to control the MEMS resonator device 300. Additional UBMs 504 and solder balls 506 are applied to the device 500 for the ASIC 502. The solder balls 304A, 304B, and 506 of device 500 are soldered to pads 508 of PCB 512. Pads 508 are connected to conductors 510 within PCB 512.

Figure 6:
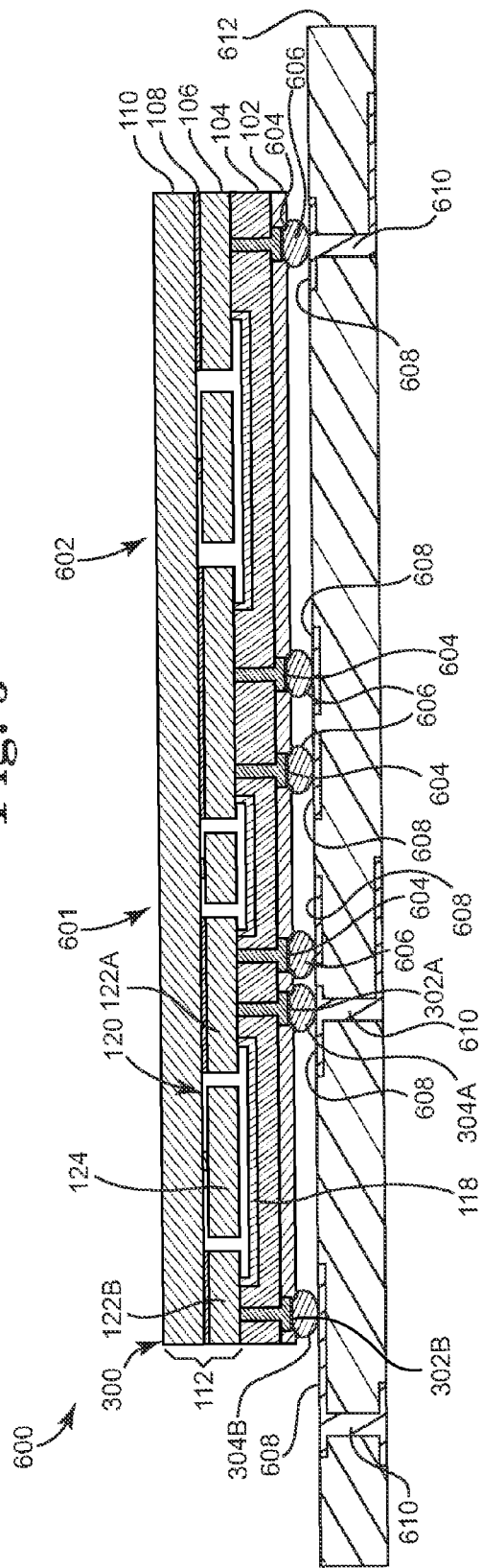
FIG. 6 is a diagram illustrating the wafer-level packaged MEMS device shown in FIG. 3B integrated with additional MEMS resonator devices according to one embodiment.

FIG. 6 is a diagram illustrating the wafer-level packaged MEMS device 300 shown in FIG. 3B integrated with additional MEMS resonator devices 601 and 602 according to one embodiment. In the illustrated embodiment, wafer-level packaged device 600 includes MEMS resonator devices 300, 601, and 602, which are integrated together on a common semiconductor die in a side-by-side manner (i.e., the three devices 300, 601, and 602 are positioned laterally adjacent to each other). Devices 601 and 602 include the same elements and are configured in the same manner as device 300. In one embodiment, device 600 is a filter device, and MEMS resonator devices 300, 601, and 602 have different geometries and are configured to operate at different frequencies. Additional UBMs 604 and solder balls 606 are applied to the device 600 for the devices 601 and 602. The solder balls 304A, 304B, and 606 of device 600 are soldered to pads 608 of PCB 612. Pads 608 are connected to conductors 610 within PCB 612.

FIG. 7 is a diagram illustrating the wafer-level packaged MEMS device 300 shown in FIG. 3B packaged together with an additional MEMS resonator device 701 in a stacked manner according to one embodiment. In the illustrated embodiment, device 700 includes MEMS resonator devices 300 and 701, which are packaged together in a face-to-face stacked manner (i.e., the active surfaces of the devices 300 and 701 are facing each other). An active surface of a device according to one embodiment is defined by a surface of the device that comprises contact pads. Device 701 includes the same elements and is configured in the same manner as device 300. In one embodiment, device 700 is a filter device, and MEMS resonator devices 300 and 701 have different geometries and are configured to operate at different frequencies. Devices 300 and 701 are electrically coupled together via UBMs 302A, 302B, and 704, and solder balls 304A and 304B. Devices 300 and 701 are electrically coupled to PCB 712 via wirebonds 714. Wirebonds 714 are attached to contact pads 706 on device 701, and are attached to pads 708 of PCB 712. Pads 708 are connected to conductors 710 within PCB 712.

FIG. 8 is a diagram illustrating the wafer-level packaged MEMS device 300 shown in FIG. 3B packaged together with two additional MEMS resonator devices 801 and 802 in a stacked manner according to one embodiment. In the illustrated embodiment, device 800 includes MEMS resonator devices 300, 801, and 802, which are packaged together in a stacked manner. Devices 801 and 802 include the same elements and are configured in the same manner as device 300. In one embodiment, device 800 is a filter device, and MEMS resonator devices 300, 801, and 802 have different geometries and are configured to operate at different frequencies. Devices 300, 801, and 802 are electrically coupled to each other and to PCB 812 via UBMs 302A, 302B, and 804, metal-filled through-silicon vias (TSVs) 806, and solder balls 304A, 304B and 808. Solder balls 808 of device 802 are attached to pads 810 of PCB 812. Pads 810 are connected to conductors 814 within PCB 812.

FIG. 9 is a diagram illustrating the wafer-level packaged MEMS device 300 shown in FIG. 3B packaged together with an application specific integrated circuit (ASIC) 902 in a stacked manner according to one embodiment. In the illustrated embodiment, device 900 includes the MEMS device 300 and the ASIC 902, which are packaged together in a stacked manner. In one embodiment, device 900 is a silicon MEMS oscillator device, and ASIC 902 is a control circuit that is configured to control the MEMS resonator device 300. Devices 300 and 902 are electrically coupled to each other and to PCB 912 via UBMs 302A, 302B, and 904, metal-filled through-silicon vias (TSVs) 906, and solder balls 304A, 304B and 908. Solder balls 908 of device 902 are attached to pads 910 of PCB 912. Pads 910 are connected to conductors 914 within PCB 912.

FIG. 10 is a diagram illustrating the wafer-level packaged MEMS device 300 shown in FIG. 3B packaged together with an application specific integrated circuit (ASIC) 1002 in a stacked manner according to another embodiment. In the illustrated embodiment, device 1000 includes the MEMS device 300 and the ASIC 1002, which are packaged together in a face-to-face stacked manner. In one embodiment, device 1000 is a silicon MEMS oscillator device, and ASIC 1002 is a control circuit that is configured to control the MEMS resonator device 300. Device 300 is electrically coupled to device 1002 via solder balls 304A and 304B, and device 1002 is electrically coupled to PCB 1012 via UBMs 1004 and solder balls 1008. Solder balls 1008 of device 1002 are attached to pads 1010 of PCB 1012. Pads 1010 are connected to conductors 1014 within PCB 1012.

Figure 11:
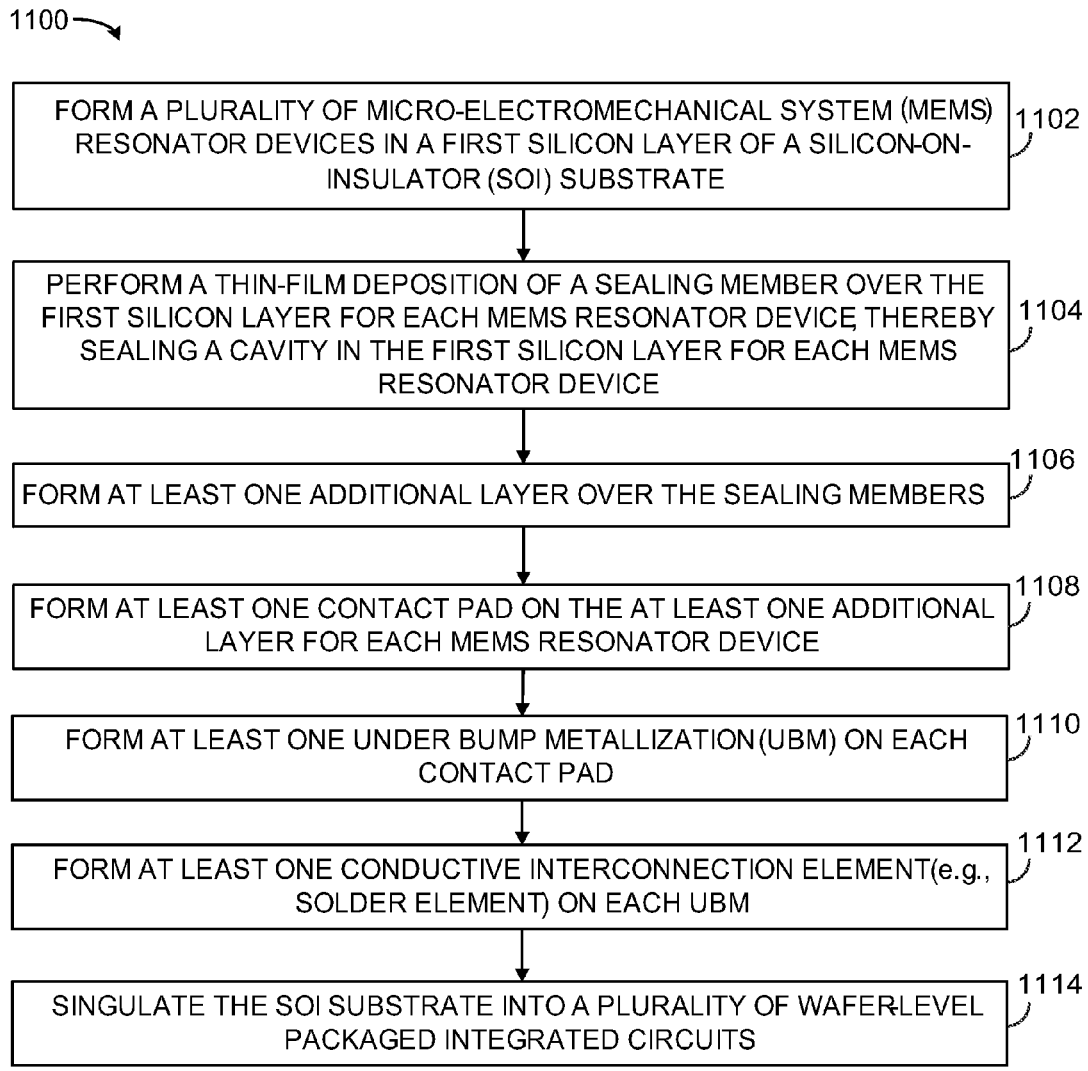
FIG. 11 is a flow diagram illustrating a method of manufacturing wafer-level packaged integrated circuits according to one embodiment.

FIG. 11 is a flow diagram illustrating a method 1100 of manufacturing wafer-level packaged integrated circuits according to one embodiment. At 1102, a plurality of micro-electromechanical system (MEMS) resonator devices are formed in a first silicon layer of a silicon-on-insulator (SOI) substrate. At 1104, a thin-film deposition of a sealing member is performed over the first silicon layer for each MEMS resonator device, thereby sealing a cavity in the first silicon layer for each MEMS resonator device. At 1106, at least one additional layer is formed over the sealing members. At 1108, at least one contact pad is formed on the at least one additional layer for each MEMS resonator device. At 1110, at least one under bump metallization (UBM) is formed on each contact pad. At 1112, at least one conductive interconnection element (e.g., solder element) is formed on each UBM. At 1114, the SOI substrate is singulated into a plurality of wafer-level packaged integrated circuits.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A wafer-level packaged integrated circuit, comprising:
a semiconductor substrate including a first silicon layer;
a micro-electromechanical system (MEMS) device integrated into the first silicon layer;
a thin-film deposited sealing member deposited over the first silicon layer and configured to seal a cavity in the first silicon layer;
at least one additional layer formed over the sealing member; and
at least one under bump metallization (UBM) formed over the at least one additional layer.

2. The integrated circuit of claim 1, and further comprising:
at least one contact pad formed on the at least one additional layer; and
wherein the at least one UBM is formed on the at least one contact pad.

3. The integrated circuit of claim 1, and further comprising:
at least one conductive interconnection structure formed on the at least one UBM.

4. The integrated circuit of claim 3, wherein the at least one conductive interconnection structure comprises at least one solder element.

5. The integrated circuit of claim 1, wherein the sealing member comprises a plurality of thin-film deposited layers.

6. The integrated circuit of claim 1, wherein the at least one UBM comprises a plurality of stacked metal layers.

7. The integrated circuit of claim 1, wherein the at least one additional layer comprises at least one insulation layer formed over the sealing member, and at least one passivation layer formed over the at least one insulation layer.

8. The integrated circuit of claim 1, wherein the MEMS device is a MEMS resonator device.

9. The integrated circuit of claim 8, wherein the MEMS resonator device includes a silicon resonator structure and a plurality of electrodes formed in the first silicon layer.

10. The integrated circuit of claim 9, and further comprising:
at least one metal-filled via in contact with at least one of the electrodes, and extending through the at least one additional layer and electrically coupled to the at least one UBM.

11. The integrated circuit of claim 1, and further comprising:
an application specific integrated circuit (ASIC) integrated into the substrate and configured to control the MEMS device.

12. The integrated circuit of claim 1, wherein the MEMS device is a first MEMS resonator device, and wherein the integrated circuit further comprises:
at least one additional MEMS resonator device integrated into the first silicon layer in a side-by-side manner with the first MEMS resonator device.

13. The integrated circuit of claim 1, wherein the integrated circuit is configured to be electrically coupled to another integrated circuit in a face-to-face manner.

14. The integrated circuit of claim 1, wherein the integrated circuit is configured to be stacked together with at least one other integrated circuit and electrically coupled to the at least one other integrated circuit by metal-filled through vias.

15. The integrated circuit of claim 1, wherein the semiconductor substrate is a silicon-on-insulator (SOI) substrate including a buried oxide layer positioned between the first silicon layer and a second silicon layer.

* * * * *